US010901330B2

(12) United States Patent
Den Boef et al.

(10) Patent No.: US 10,901,330 B2
(45) Date of Patent: Jan. 26, 2021

(54) RECIPE SELECTION BASED ON INTER-RECIPE CONSISTENCY

(71) Applicant: ASML NETHERLANDS B.V., Veldhoven (NL)

(72) Inventors: Arie Jeffrey Den Boef, Waalre (NL); Timothy Dugan Davis, Portland, OR (US); Peter David Engblom, Portland, OR (US); Kaustuve Bhattacharyya, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/417,706

(22) Filed: May 21, 2019

(65) Prior Publication Data

US 2019/0271921 A1 Sep. 5, 2019

Related U.S. Application Data

(63) Continuation of application No. 15/181,126, filed on Jun. 13, 2016, now Pat. No. 10,338,484.

(Continued)

(51) Int. Cl.
*G03F 9/00* (2006.01)
*G03F 7/20* (2006.01)
*G01B 11/27* (2006.01)

(52) U.S. Cl.
CPC .......... *G03F 9/7069* (2013.01); *G01B 11/272* (2013.01); *G03F 7/70633* (2013.01)

(58) Field of Classification Search
CPC ...... G03F 9/00; G03F 9/7069; G03F 7/70633; G01B 11/272

(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 103426980 | 12/2013 |
| CN | 104199257 | 12/2014 |

(Continued)

OTHER PUBLICATIONS

Daniel Kandel et al., "Overlay accuracy fundamentals," Proc. of SPIE, vol. 8324, pp. 832417-1-832417-10, Mar. 29, 2012.

(Continued)

*Primary Examiner* — Roy M Punnoose
(74) *Attorney, Agent, or Firm* — Pillsbury Winthrop Shaw Pittman LLP

(57) ABSTRACT

A method including: determining recipe consistencies between one substrate measurement recipe of a plurality of substrate measurement recipes and each other substrate measurement recipe of the plurality of substrate measurement recipes; calculating a function of the recipe consistencies; eliminating the one substrate measurement recipe from the plurality of substrate measurement recipes if the function meets a criterion; and reiterating the determining, calculating and eliminating until a termination condition is met. Also disclosed herein is a substrate measurement apparatus, including a storage configured to store a plurality of substrate measurement recipes, and a processor configured to select one or more substrate measurement recipes from the plurality of substrate measurement recipes based on recipe consistencies among the plurality of substrate measurement recipes.

20 Claims, 19 Drawing Sheets

Related U.S. Application Data

(60) Provisional application No. 62/181,047, filed on Jun. 17, 2015.

(58) Field of Classification Search
USPC .......................................................... 356/138
See application file for complete search history.

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,961,116 | B2 | 11/2005 | Den Boef et al. |
| 7,239,368 | B2 | 7/2007 | Oesterholt et al. |
| 8,411,287 | B2 | 4/2013 | Smilde et al. |
| 8,786,824 | B2 | 7/2014 | Jansen |
| 8,867,020 | B2 | 10/2014 | Smilde et al. |
| 9,081,303 | B2 | 7/2015 | Cramer et al. |
| 9,605,947 | B2 | 3/2017 | Kreuzer et al. |
| 2004/0038455 | A1 | 2/2004 | Seligson et al. |
| 2006/0274312 | A1* | 12/2006 | Endo ................ G03F 7/70633 356/400 |
| 2007/0229837 | A1 | 10/2007 | Van Der Schaar et al. |
| 2009/0157630 | A1 | 6/2009 | Yuan |
| 2010/0119961 | A1 | 5/2010 | Ye et al. |
| 2010/0315614 | A1 | 12/2010 | Hansen |
| 2011/0027704 | A1 | 2/2011 | Cramer et al. |
| 2011/0043791 | A1 | 2/2011 | Smilde et al. |
| 2012/0013881 | A1 | 1/2012 | Den Boef et al. |
| 2012/0123581 | A1 | 5/2012 | Smilde et al. |
| 2012/0242970 | A1 | 9/2012 | Smilde et al. |
| 2013/0035888 | A1 | 2/2013 | Kandel et al. |
| 2013/0054186 | A1 | 2/2013 | Den Boef |
| 2013/0245985 | A1* | 9/2013 | Flock .................... G05B 23/00 702/105 |
| 2013/0259358 | A1 | 10/2013 | Chen et al. |
| 2014/0340682 | A1* | 11/2014 | Kwak .................. G01N 21/274 356/369 |
| 2015/0109624 | A1 | 4/2015 | Kreuzer et al. |
| 2015/0323471 | A1 | 11/2015 | Sapiens et al. |

FOREIGN PATENT DOCUMENTS

| | | |
|---|---|---|
| CN | 104516216 | 4/2015 |
| JP | 2006140753 | 1/2006 |
| JP | 2006317306 | 11/2006 |
| JP | 2007527531 | 9/2007 |
| JP | 2007273605 | 10/2007 |
| JP | 2010114444 | 5/2010 |
| JP | 2013051412 | 3/2013 |
| JP | 2013535819 | 9/2013 |
| JP | 2014502420 | 1/2014 |
| JP | 2014512101 | 5/2014 |
| KR | 10-2006-0056516 | 5/2006 |
| WO | 02/19415 | 3/2002 |
| WO | 2006019166 | 2/2006 |
| WO | 2009/078708 | 6/2009 |
| WO | 2009/106279 | 9/2009 |
| WO | 2010/059954 | 5/2010 |
| WO | 2016086056 | 6/2016 |

OTHER PUBLICATIONS

Peng Liu et al., "Fast 3D thick mask model for full-chip EUVL simulations," Proc. of SPIE, vol. 8679, pp. 86790W-1-86790W-16, Apr. 1, 2013.

Chinese Office Action issued in Chinese Patent Application No. 105119206, dated May 9, 2018, with English translation.

International Search Report and Written Opinion dated Oct. 18, 2016 in corresponding International Patent Application No. PCT/EP2016/063313.

Honggoo Lee et al., "Overlay Measurement Accuracy Enhancement by Design and Algorithm," Proc. of SPIE, vol. 9424, pp. 94242B-1-94242B-4, Mar. 2015.

Eran Amit et al., "Overlay accuracy calibration," Proc. of SPIE, vol. 8681, pp. 86811G1-86811G-6, 2013.

Taiwan Office Action dated Jul. 6, 2017 in corresponding Taiwan Patent Application No. 105119206.

Japanese Office Action issued in corresponding Japanese Patent Application No. 2017-565761, dated Feb. 5, 2019.

Chinese Office Action issued in corresponding Chinese Patent Application No. 2016800487240, dated Jul. 10, 2019.

Japanese Office Action issued in corresponding Japanese Patent Application No. 2019-087693, dated Mar. 10, 2020.

Japanese office Action issued in corresponding Japanese Patent Application No. 2017-565761, dated Jul. 9, 2019.

Chinese Office Action issued in corresponding Chinese Patent Application No. 201680048724.0, dated Jul. 29, 2020.

* cited by examiner

|   | A   | B   | C   | D   |
|---|-----|-----|-----|-----|
| A | 0.0 | 1.5 | 2.1 | 3.0 |
| B | 1.5 | 0.0 | 2.0 | 1.0 |
| C | 2.1 | 2.0 | 0.0 | 1.5 |
| D | 3.0 | 1.0 | 1.5 | 0.0 |
| Σ | 6.6 | 4.5 | 5.6 | 5.5 |

|   |   | B   | C   | D   |
|---|---|-----|-----|-----|
| B |   | 0.0 | 2.0 | 1.0 |
| C |   | 2.0 | 0.0 | 1.5 |
| D |   | 1.0 | 1.5 | 0.0 |
| Σ |   | 3.0 | 3.5 | 2.5 |

|   |   | B   |   | D   |
|---|---|-----|---|-----|
| B |   | 0.0 |   | 1.0 |
| D |   | 1.0 |   | 0.0 |
| Σ |   | 1.0 |   | 1.0 |

RECIPE SELECTION BASED ON INTER-RECIPE CONSISTENCY

This application is a continuation of pending U.S. patent application Ser. No. 15/181,126, filed Jun. 13, 2016, which claims priority to U.S. Patent Application No. 62/181,047, filed Jun. 17, 2015, each of the foregoing applications is incorporated herein in its entirety by reference.

TECHNICAL FIELD

The description herein relates to metrology and lithographic apparatuses and processes.

BACKGROUND

A lithographic apparatus can be used, for example, in the manufacture of integrated circuits (ICs) or other devices. In such a case, a patterning device (e.g., a mask) may contain or provide a circuit pattern corresponding to an individual layer of the device ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic apparatus, one target portion at a time. In one type of lithographic apparatus, the circuit pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various procedures such as etching, ion-implantation (doping), metallization, oxidation, chemo-mechanical polishing, etc., all intended to finish off the individual layer of the device. If several layers are required in the device, then some or all of these procedures or a variant thereof may be repeated for each layer. Eventually, a device will be present in each target portion on the substrate. If there is a plurality of devices, these devices are then separated from one another by a technique such as dicing or sawing, whence the individual devices can be mounted on a carrier, connected to pins, etc.

SUMMARY

Disclosed herein is a method comprising: determining recipe consistency within each of a plurality of subsets of substrate measurement recipes selected from a plurality of substrate measurement recipes based on values of a characteristic at a plurality of areas on a substrate obtained using the plurality of substrate measurement recipes; and selecting a substrate measurement recipe from the plurality of substrate measurement recipes based on the recipe consistency.

According to an embodiment, the characteristic comprises overlay error or a relative position of a substrate.

According to an embodiment, the method further comprises obtaining the values of the characteristic by measuring or simulating diffracted radiation from the areas.

According to an embodiment, obtaining the values comprises measuring or simulating a difference between amplitudes of two diffraction orders of the diffracted radiation from the areas.

According to an embodiment, each of the areas comprises a target structure, the target structure comprising overlaid periodic structures having a known overlay error bias.

According to an embodiment, the plurality of substrate measurement recipes differ in one or more parameters selected from: wavelength of radiation used in a measurement or simulation to arrive at the values, polarization of radiation used in a measurement or simulation to arrive at the values, targets within the areas used in a measurement or simulation to arrive at the values, or angle of incidence of radiation used in a measurement or simulation to arrive at the values.

According to an embodiment, the recipe consistency within each subset is a function of differences of the values measured by or simulated for, at the plurality of areas, one substrate measurement recipe of the subset and the values measured by or simulated for, at the plurality of areas, another substrate measurement recipe of the subset.

According to an embodiment, the recipe consistency is a function of the sum of squares of the differences.

According to an embodiment, the recipe consistency is a covariance.

According to an embodiment, the recipe consistency within each subset is a function of regression between the values measured by or simulated for, at the plurality of areas, one substrate measurement recipe of the subset and the values measured by or simulated for, at the plurality of areas, another substrate measurement recipe of the subset.

According to an embodiment, the recipe consistency within each subset is a function of cosine similarities and Euclidian distances of the values of the overlay error.

According to an embodiment, selecting the substrate measurement recipe comprises calculating a sum of recipe consistencies within all subsets that have a substrate measurement recipe in common.

According to an embodiment, selecting the substrate measurement recipe comprises eliminating a substrate measurement recipe from the plurality of substrate measurement recipes based on the recipe consistency.

According to an embodiment, the method further comprises eliminating values that do not meet one or more detectability criteria, from the values measured or simulated.

According to an embodiment, the method further comprises inspecting the substrate using a selected substrate measurement recipe.

According to an embodiment, the method further comprises, prior to determining the recipe consistency, determining detectability of a substrate measurement recipe and if the detectability for the substrate measurement recipe crosses a threshold, excluding that substrate measurement recipe from the plurality of substrate measurement recipes.

Disclosed herein is a method comprising: determining recipe consistencies between one substrate measurement recipe of a plurality of substrate measurement recipes and each other substrate measurement recipe of the plurality of substrate measurement recipes; calculating a function of the recipe consistencies; eliminating the one substrate measurement recipe from the plurality of substrate measurement recipes if the function meets a criterion; and reiterating the determining, calculating and eliminating until a termination condition is met.

According to an embodiment, the recipe consistencies are determined from values of a characteristic at a plurality of areas on a substrate obtained using the plurality of substrate measurement recipes.

According to an embodiment, the characteristic is overlay error or a relative position of a substrate.

According to an embodiment, the values are obtained by measuring or simulating diffracted radiation from the areas.

According to an embodiment, the values are obtained by measuring or simulating a difference between amplitudes of two diffraction orders of the diffracted radiation from the areas.

According to an embodiment, each of the areas comprises a target structure, the target structure comprising overlaid periodic structures having a known overlay error bias.

According to an embodiment, the plurality of substrate measurement recipes differ in one or more parameters selected from: wavelength of radiation used in a measurement or simulation to arrive at the values, polarization of radiation used in a measurement or simulation to arrive at the values, targets within the areas used in a measurement or simulation to arrive at the values, or angle of incidence of radiation used in a measurement or simulation to arrive at the values.

According to an embodiment, the method further comprises, inspecting a substrate using a remaining substrate measurement recipe of the plurality of substrate measurement recipes.

Disclosed herein is a method comprising: performing a substrate measurement recipe-to-substrate measurement recipe consistency analysis among a plurality of substrate measurement recipes; and identifying, from the analyzed substrate measurement recipes, a substrate measurement recipe with a measure of substrate measurement recipe-to-substrate measurement recipe consistency, a measure of susceptibility to process variation, or a measure of robustness to process variation, that crosses a threshold.

Disclosed herein is a computer program product comprising a computer readable medium having instructions recorded thereon, the instructions when executed by a computer implementing the method of any of claims 1-25.

Also disclosed herein is a substrate inspection apparatus, comprising a storage configured to store a plurality of substrate measurement recipes for inspection, and a processor configured to select one or more substrate measurement recipes from the plurality of substrate measurement recipes based on recipe consistencies among the plurality of substrate measurement recipes.

According to an embodiment, the apparatus further comprises a support for a substrate having a plurality of target structures thereon, each target structure comprising overlaid periodic structures having a known overlay error bias; and an optical system configured to illuminate each target structure and detect radiation diffracted by each target structure.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting an apparatus, e.g., an inspection apparatus or lithographic apparatus, such that processes and/or results (e.g., of measurement using metrology or of device manufacturing using lithography) have one or more desirable characteristics, such as higher accuracy of measurement or of projection of a design layout on a substrate, higher measurement precision, larger process window, etc.

Figure 1A:
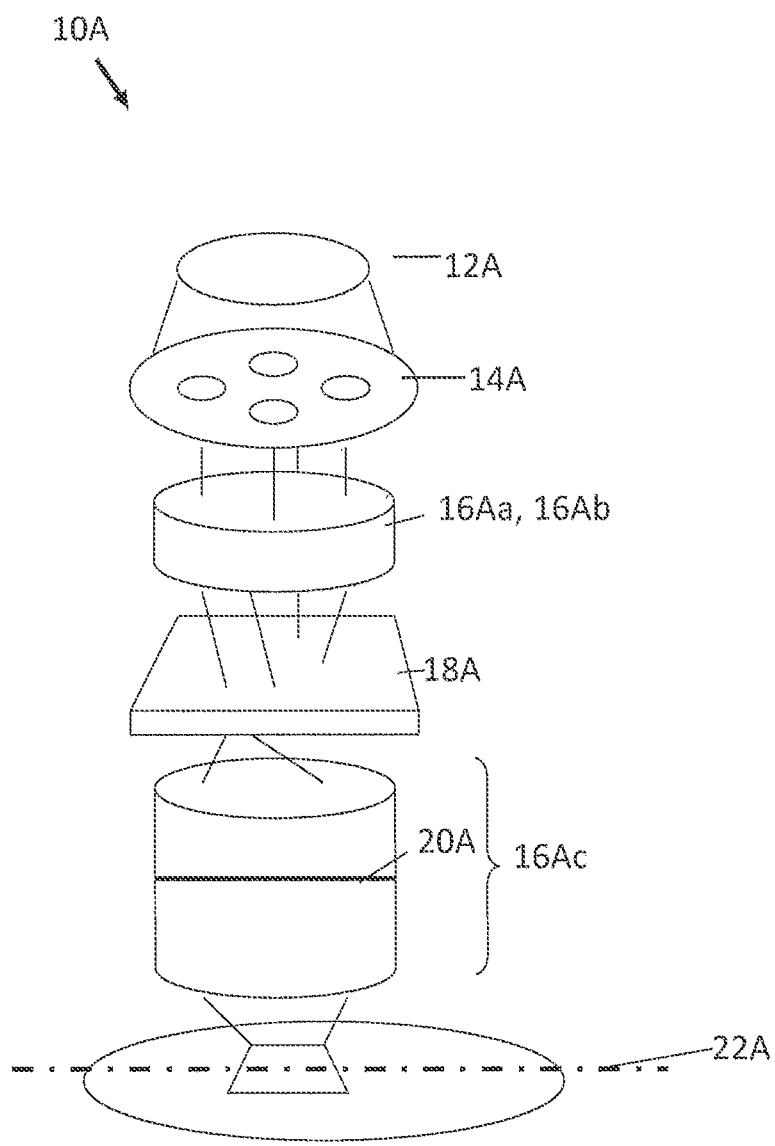
FIG. 1A is a block diagram of various subsystems of a lithography system.

As a brief introduction, FIG. 1A illustrates an exemplary lithographic apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithographic apparatus itself need not have the radiation source); and optics 16Ac that project an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin(emax).

In a lithographic apparatus, projection optics direct and shape the illumination from a source via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic apparatus (e.g., properties of the source, the patterning device and the projection optics) dictate the aerial image. Since the patterning device used in the lithographic apparatus can be changed, it is desirable to separate the optical properties of the patterning device from the optical properties of the rest of the lithographic apparatus including at least the source and the projection optics.

Figure 1B:
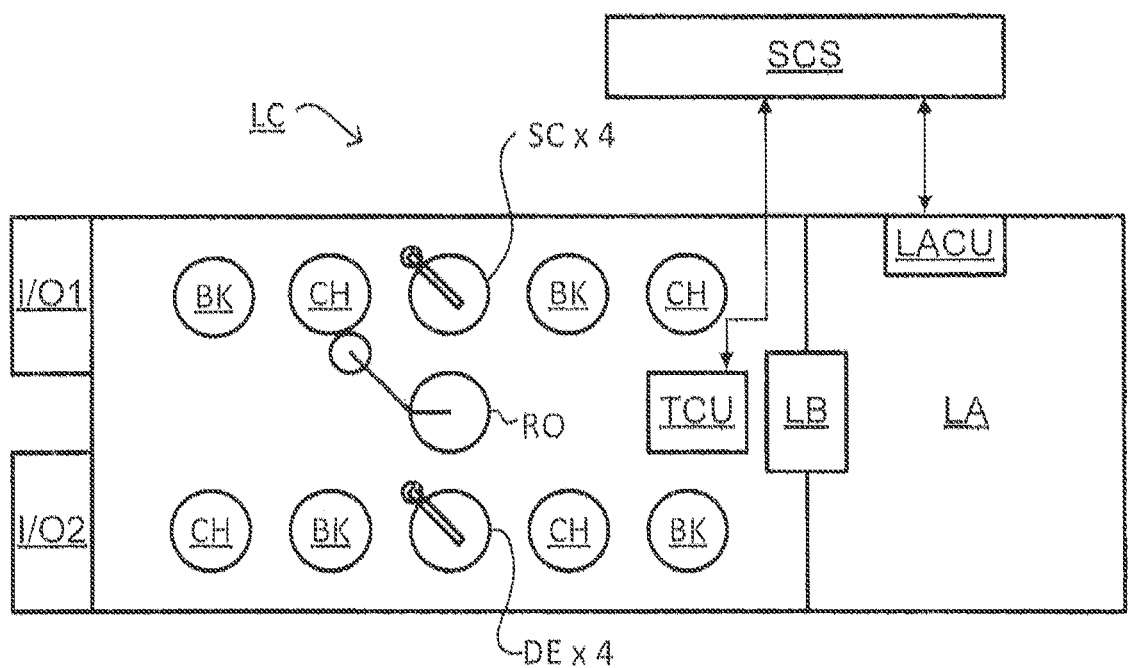
FIG. 1B schematically depicts an embodiment of a lithographic cell or cluster.

As shown in FIG. 1B, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency. The lithographic cell LC may further comprises one or more etchers to etch the substrate and one or more measuring devices configured to measure a parameter of the substrate. The measuring device may comprise an optical measurement device or inspection apparatus configured to measure a physical parameter of the substrate, such as a scatterometer, a scanning electron microscope, etc.

In device fabrication process (e.g., a lithographic process which comprises a lithography method and optionally one or more other methods such a resist coating, etching, development, etc.), a substrate and/or other structure may be subjected to various types of measurement during or after the process. The measurement may determine, for example, whether a particular substrate is defective, may establish adjustments to a method and/or apparatus used in the process (e.g., aligning two layers on a substrate or aligning the patterning device to the substrate), may measure the performance of a method in the process, of the process itself and/or an apparatus used in the process, or may be for other purposes. Examples of measurement include optical imaging (e.g., optical microscope), non-imaging optical measurement (e.g., measurement based on diffraction such as metrology using an ASML YieldStar tool and/or alignment measurement using an ASML SMASH GridAlign tool), mechanical measurement (e.g., profiling using a stylus, atomic force microscopy (AFM)), non-optical imaging (e.g., scanning electron microscopy (SEM)), etc. The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Figure 2A:
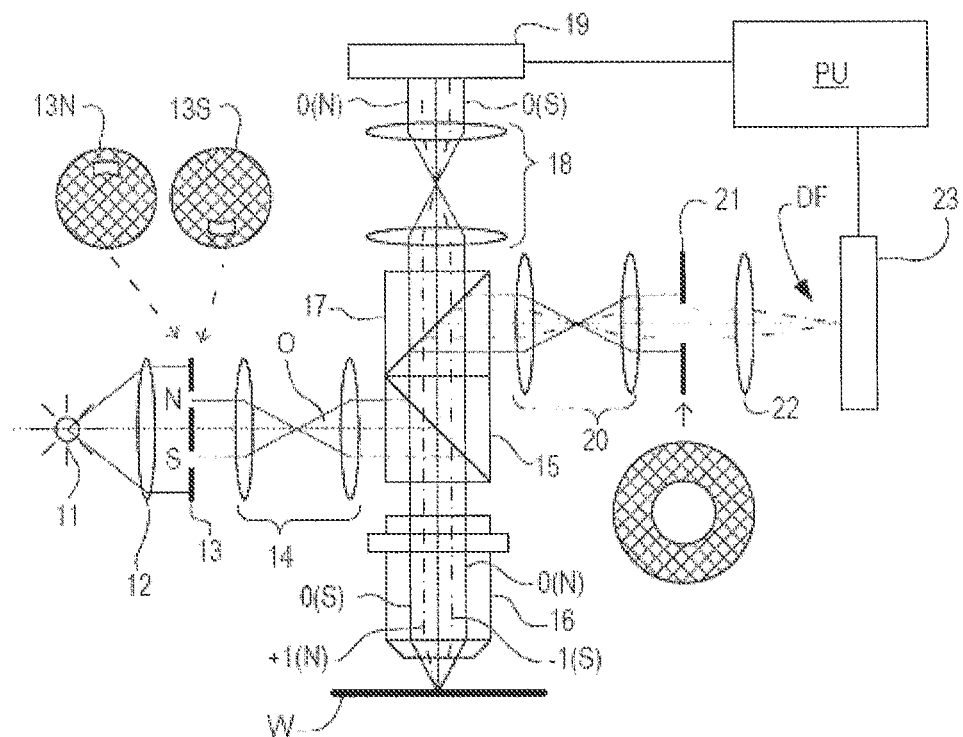
FIG. 2A schematically depicts an example inspection apparatus and metrology technique.

An embodiment of an inspection (e.g., metrology) apparatus is shown in FIG. 2A. A target T (comprising a periodic structure such as a grating) and diffracted rays are illustrated in more detail in FIG. 2B. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides radiation redirected by the substrate onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate or device 13 of suitable form between lenses 12 and 14, in a plane which is a back-projected image of the objective lens pupil plane. In the example illustrated, aperture plate or device 13 is in the form of plates (or portions of a plate) having different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

Figure 2B:
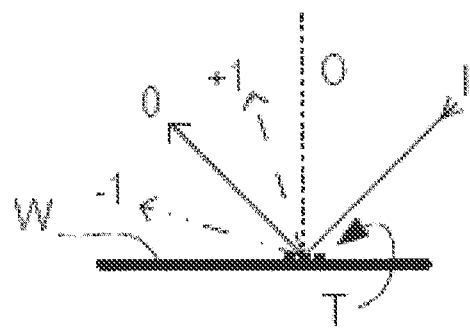
FIG. 2B is a schematic detail of a diffraction spectrum of a target for a given direction of illumination.

As shown in FIG. 2B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIG. 2A and FIG. 2B are shown somewhat off axis, purely to enable them to be more easily distinguished in the diagram.

At least the 0 and +1 orders diffracted by the target on substrate W are collected by objective lens 16 and directed back through prism 15. Returning to FIG. 2A, both the first and second illumination modes are illustrated, by designating diametrically opposite apertures labeled as north (N) and south (S). When the incident ray I is from the "north" side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1$^{st}$ and the +1$^{st}$ diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

Figure 2C:
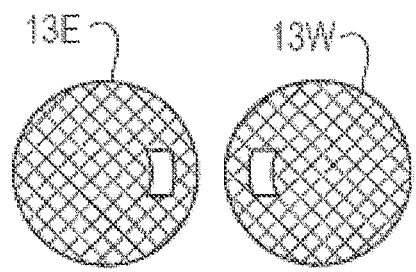
FIG. 2C is a schematic illustration of a pair of illumination apertures providing an illumination mode in using a measurement apparatus for, e.g., diffraction based overlay measurements.
Figure 2D:
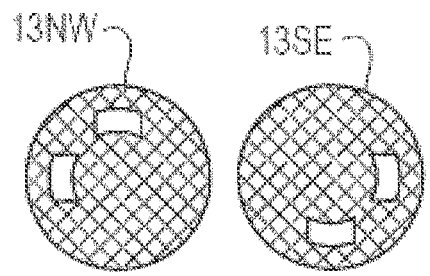
FIG. 2D is a schematic illustration of a pair of illumination apertures providing an illumination mode in using a measurement apparatus for, e.g., diffraction based overlay measurements.

The particular forms of aperture plate 13 and stop 21 shown in FIGS. 2A, 2C and 2D are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIG. 2C and FIG. 2D. FIG. 2C illustrates two further types of off-axis illumination mode. In a first illumination mode of FIG. 2C, aperture plate 13E provides off-axis illumination from a direction designated, for the sake of description only, as 'east' relative to the 'north' previously described. In a second illumination mode of FIG. 2D, aperture plate 13W is used to provide similar illumination, but from an opposite direction, labeled 'west'. FIG. 2D illustrates two further types of off-axis illumination mode. In a first illumination mode of FIG. 2D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned herein.

Figure 2E:
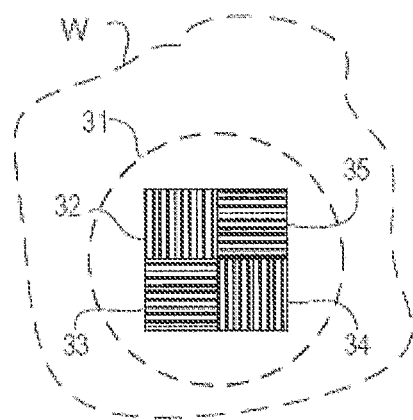
FIG. 2E depicts a form of multiple periodic structure (e.g., multiple grating) target and an outline of a measurement spot on a substrate.

FIG. 2E depicts an example composite metrology target formed on a substrate. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Figure 2F:
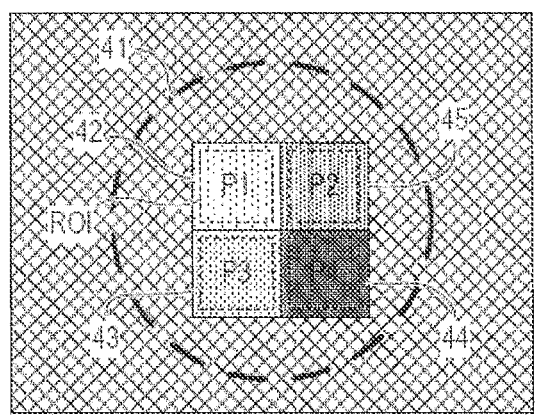
FIG. 2F depicts an image of the target of FIG. 2E obtained using, for example, the apparatus of FIG. 2A.

FIG. 2F shows an example of an image that may be formed on and detected by the sensor 23, using the target of FIG. 2E in the apparatus of FIG. 2A, using the aperture plates 13NW or 13SE from FIG. 2D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

A target may comprise a relatively large periodic structure layout (e.g., comprising one or more gratings), e.g., 40 µm by 40 µm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target may be reduced, e.g., to 20 µm by 20 µm or less, or to 10 µm by 10 µm or less. In this situation, the periodic structure layout may be made smaller than the measurement spot (i.e., the periodic structure layout is overfilled). Such a target may be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011/0027704, US2011/0043791 and US2012/0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. The pattern of the grating is sensitive to chromatic aberrations in the lithographic projection apparatus, particularly the projection system PS, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to a reconstruction process, performed by processing unit PU, from knowledge of the printing step and/or other measurement processes.

In order to obtain useful data, a substrate measurement recipe should be both sufficiently accurate and precise. Accuracy and precision are related but distinct concepts. The accuracy of a measurement of a quantity is the degree of closeness of the measured value of the quantity to the true value of the quantity. The precision of a measurement, related to reproducibility and repeatability, is the degree to which repeated measurements of a quantity under unchanged conditions show the same results. Although the two terms precision and accuracy can be synonymous in colloquial use, they are deliberately contrasted in the context of the scientific method and in this disclosure. A measurement can be accurate but not precise, precise but not accurate, neither, or both. For example, if a measurement contains a systematic error, then increasing the sample size (i.e., number of repetitions) generally increases precision but does not improve accuracy. Eliminating the systematic error improves accuracy but does not change precision.

So, to ascertain the precision of a measurement does not necessarily require knowledge of the true value of the quantity measured. The precision of a measurement of a quantity may be limited by the nature of the measurement, the apparatus used for the measurement, the environment, or even the physics involved in the measurement. However, to ascertain the accuracy of a measurement may be difficult without knowing the true value of the quantity measured.

In the context of a device fabrication process, to determine whether a substrate measurement recipe is accurate may be challenging because it is not always economical or even physically feasible to obtain the true value, or a good approximate thereof, of a characteristic of patterns imaged to the substrate. However, if several substrate measurement recipes are consistent (i.e., yielding similar data), they must have similar systematic errors or must all have small systematic errors. The chances of the former are slim when the substrate measurement recipes are dissimilar. Therefore, if several substrate measurement recipes are consistent, these recipes are probably accurate—they all have small systematic errors. This principle is certainly not limited to substrate measurement recipes for a device fabrication process, but is applicable to any substrate measurement recipes.

The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. The one or more patterns measured may be one or more patterns whose diffraction is measured (also known as "targets" or "target structures"). The one or more patterns measured may be one or more patterns specially designed for measurement purposes. Multiple copies of a target may be placed on many places on a substrate. The one or more parameters of the one or more patterns measured may include the shape, orientation and/or size of the one or more patterns. A substrate measurement recipe may be used to align, or measure alignment of, a layer of a pattern being imaged against an existing pattern on a substrate (e.g., overlay). A substrate measurement recipe may be used to determine alignment between two objects, such as alignment between a patterning device and a resist-coated substrate or between a resist-coated substrate and a substrate table, by respectively measuring the relative position between the patterning device and the resist-coated substrate or the relative position between the resist-coated substrate and the substrate table. As used herein, the substrate associated with the substrate measurement recipe is not limited to a substrate onto which a device is, or is being, formed. The substrate associated with the substrate measurement recipe can be any kind of substrate, including a substrate table, a patterning device, etc.

A substrate measurement recipe may thus be expressed in a mathematical form: $(r_1, r_2, r_3, \ldots r_n; t_1, t_2, t_3, \ldots t_n)$, where $r_i$ are parameters of the measurement and $t_j$ are parameters of the one or more patterns measured. The substrate measurement recipe will typically comprises a plurality of parameters selected from parameters of the measurement and/or parameters of the one or more patterns measured. For example, the measurement recipe may have a parameter of the measurement and a parameter of the one or more patterns measured. Further, a substrate measurement recipe need not have parameters of the measurement (and thus have only one or more parameters of the one or more patterns measured) or not have parameters of the one or more patterns measured (and this have only one or more parameters of the measurement).

Figure 3:
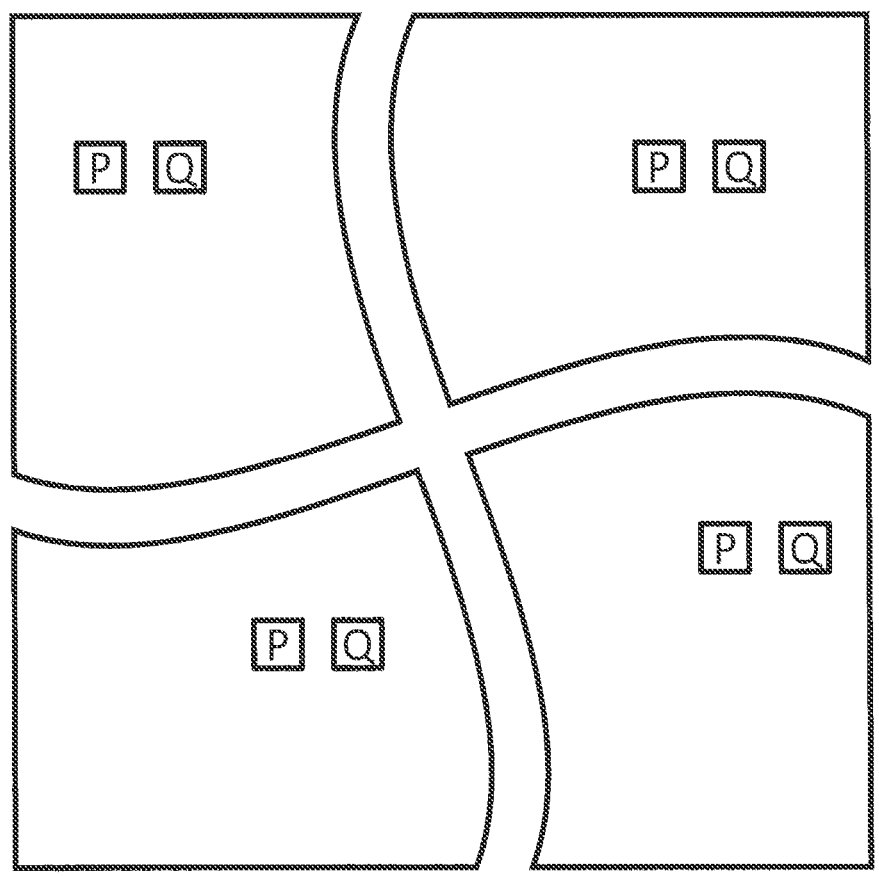
FIG. 3 schematically shows a substrate with two distinct targets P and Q, where copies of each are placed in four different areas of the substrate.

FIG. 3 schematically shows a substrate with two distinct targets P and Q, where copies of each are placed in four different areas of the substrate. The targets may include a periodic structure, such as one or more gratings, e.g., a plurality of gratings, which may have one or more gratings of mutually perpendicular directions. The substrate of FIG. 3 may be subjected to measurement using two substrate measurement recipes A and B. Substrate measurement recipes A and B at least differ in one parameter, namely the target measured (e.g., A measures target P and B measures target Q). Substrate measurement recipes A and B may also differ on one or more parameters of their measurement. Substrate measurement recipes A and B may not even be based on the same measurement technique. For example, substrate measurement recipe A may be based on SEM measurement and substrate measurement recipe B may be based on AFM measurement. If the substrate measurement recipes A and B are consistent, the substrate measurement recipes A and B should yield similar data from each of the four areas.

A plurality of substrate measurement recipes is consistent when the recipe consistency among the recipes satisfies one or more criteria (e.g., being above a threshold). The recipe consistency among the recipes is a function that measures the differences of data obtained at one or more areas on the substrate by the recipes. The data obtained may be values of a characteristic actually measured or simulated. For example, the consistency may be a function that measures the differences between the overlay errors or relative positions (e.g., positions relative to a patterning device) of the substrate obtained by diffraction-based substrate measurement recipes from a number of different areas on the substrate. In an embodiment, the recipe consistency does not measure the similarity between the parameters of the substrate measurement recipes but measures the similarity between the data obtained by the substrate measurement recipes. For example, two recipes may be consistent (i.e., recipe consistency above a threshold) even if they use totally different measurement techniques (e.g., one uses SEM and the other uses diffraction-based optical measurement; one uses diffraction-based overlay measurement and the other uses alignment measurement). Conversely, two recipes may be identical in their parameters but are still inconsistent (e.g., the recipes in FIG. 5A and FIG. 5B discussed hereafter).

Figure 4A:
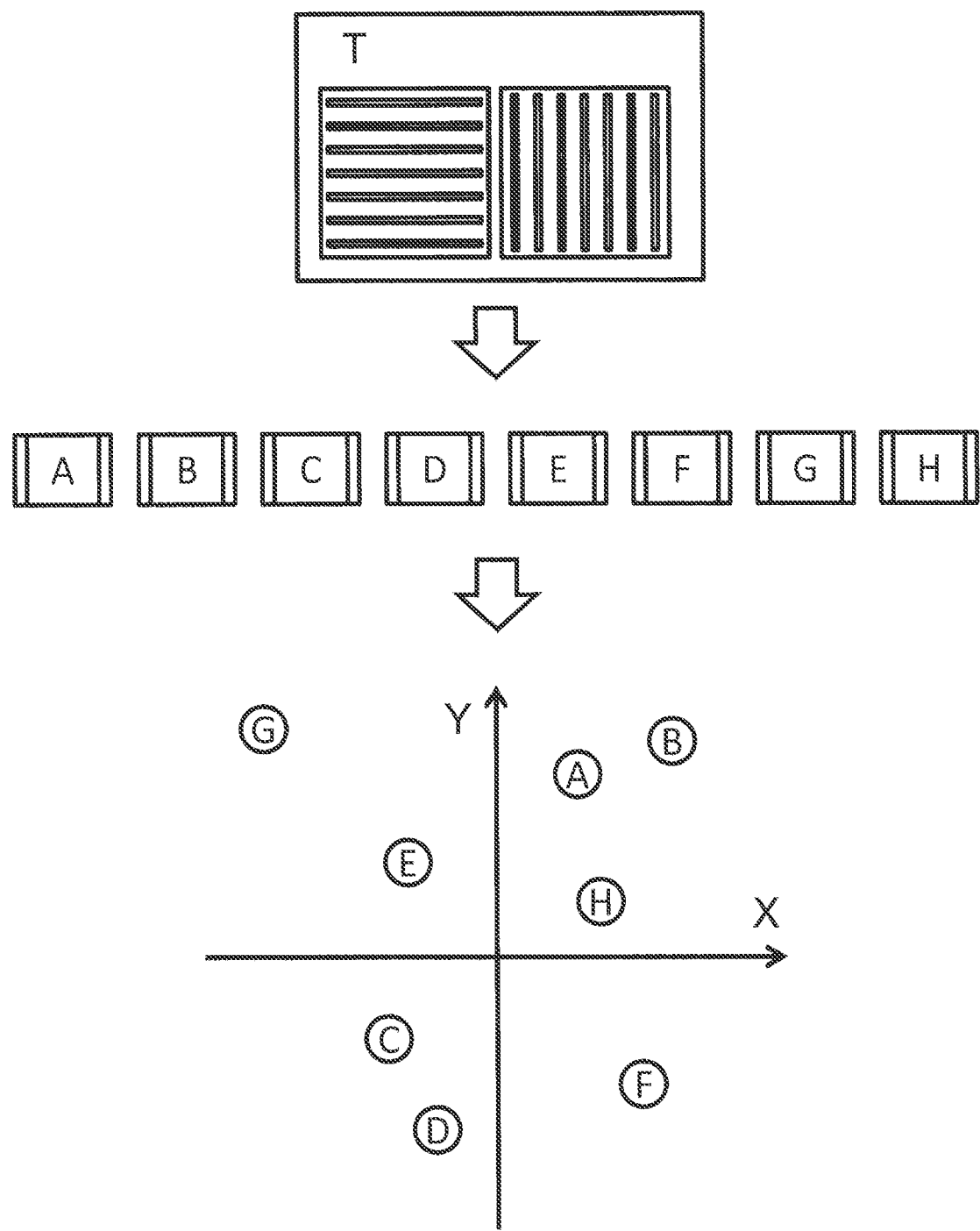
FIG. 4A schematically shows example results of example substrate measurement recipes A-H, where these inspection recipes are not consistent.

FIG. 4A schematically shows example results of example substrate measurement recipes A-H, where these substrate measurement recipes are not consistent. Each of the recipes measures an overlay error in X direction and an overlay error in Y direction (perpendicular to X direction) from a pattern. Therefore, the overlay errors measured by each of the recipes may be represented by a 2-D graph where the overlay error measured by each recipe is represented by a point thereon with the same label as that recipe. The fact that these points do not tightly converge means that these recipes are not consistent. These recipes thus cannot be all accurate. It is possible that none of these recipes are accurate.

Figure 4B:
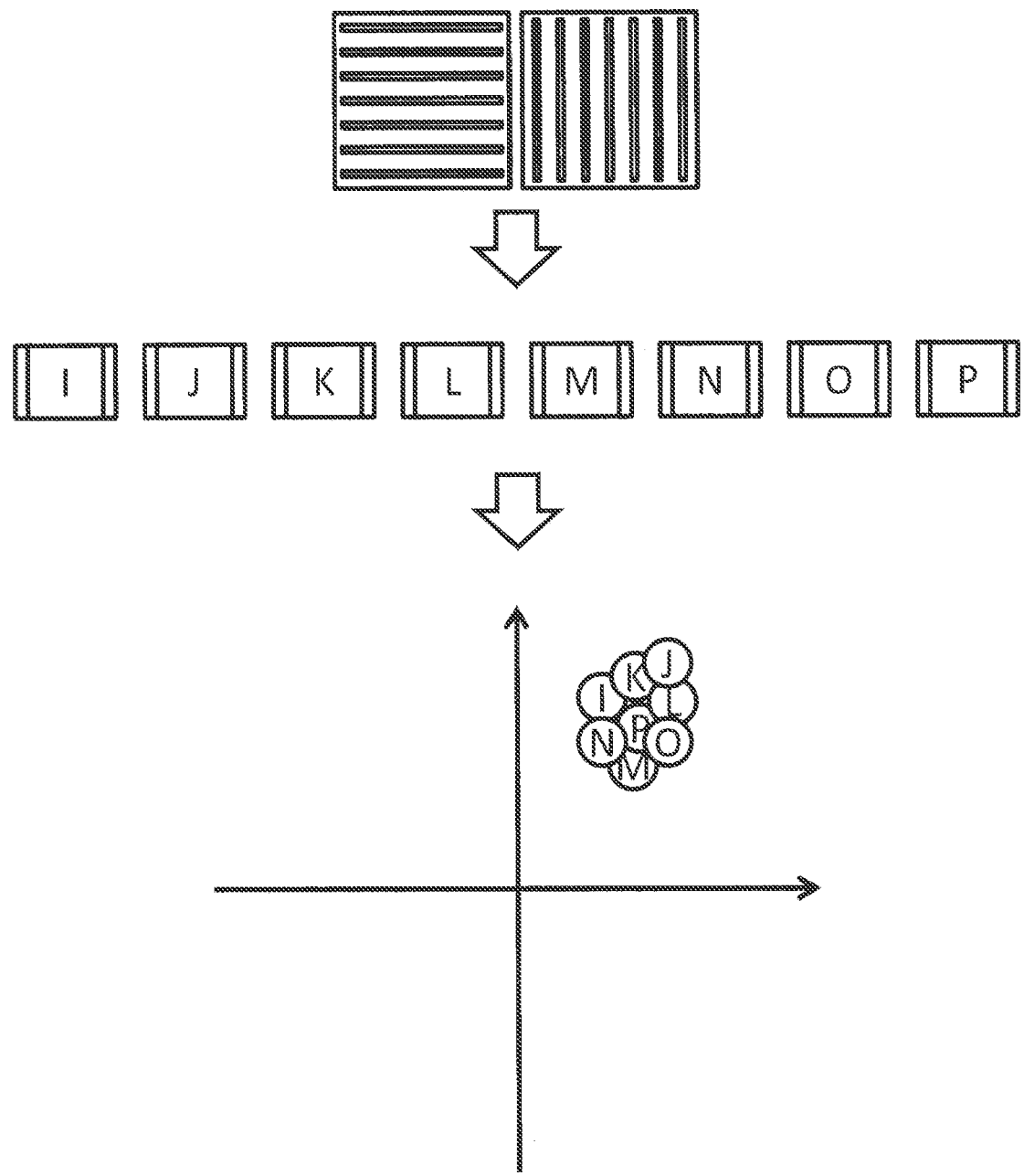
FIG. 4B schematically shows example results of example substrate measurement recipes I-P, where these inspection recipes are consistent.

FIG. 4B schematically shows the results of example substrate measurement recipes I-P, where these substrate measurement recipes are consistent. Each of the recipes measures an overlay error in X direction and an overlay error in Y direction (perpendicular to X direction) from a pattern. Therefore, the overlay errors measured by each of the recipes may be represented by a 2-D graph where the overlay error measured by each recipe is represented by a point thereon with the same label as that recipe. The fact that these points tightly converge means that these recipes are consistent. These recipes thus are probably all accurate.

The accuracy of a substrate measurement recipe in the context of a device fabrication process may be affected by one or more physical and/or chemical effects. These effects may impact different substrate measurement recipes differently. Namely these effects may cause a great systematic error in some substrate measurement recipes thereby making them inaccurate while causing a very small systematic error in others. Due to the difference in the substrate measurement recipes (parameter $r_i$, $t_j$ or both), some substrate measurement recipes may be more robust against these effects than others.

Figure 5A:
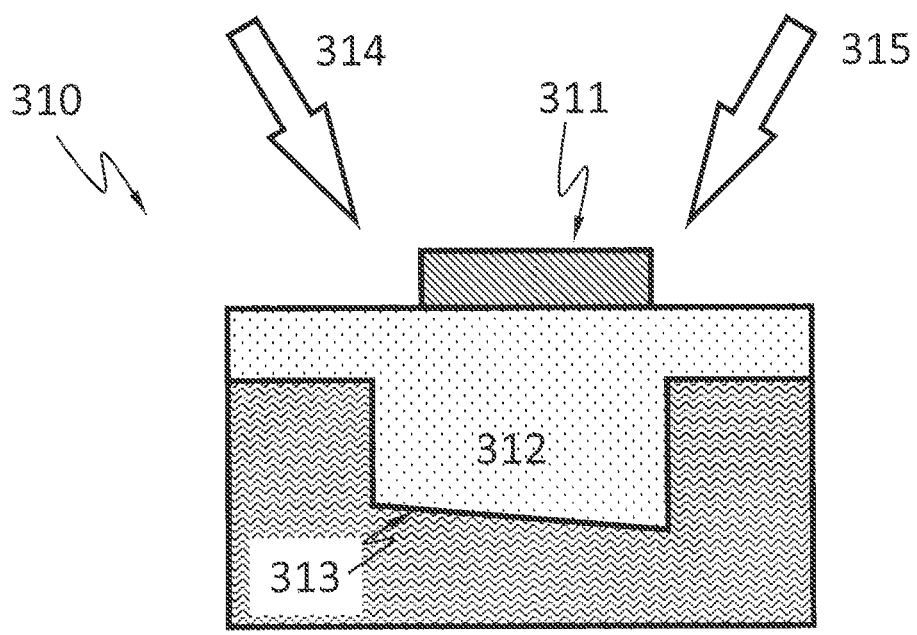
FIG. 5A and FIG. 5B demonstrate how a same target may introduce different systematic errors in the same or different substrate measurement recipes.
Figure 5B:
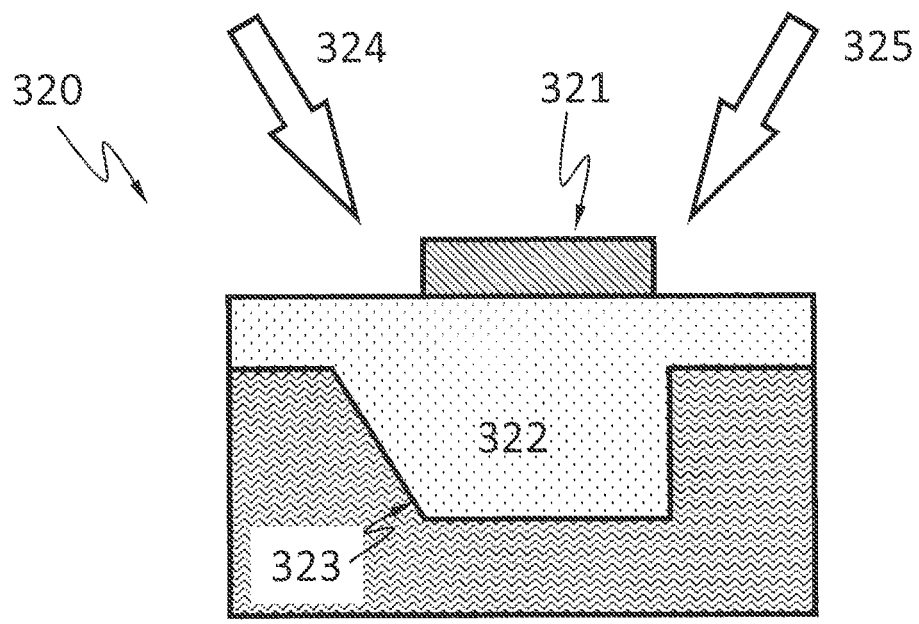

FIG. 5A and FIG. 5B demonstrate how the stack of a same target may introduce different systematic errors for same or different substrate measurement recipes. FIG. 5A schematically shows a cross-sectional view of the stack of a target 310 including an upper structure 311 over a trench 312, suitable for measuring overlay error between the upper structure 311 and the trench 312. The bottom 313 of the trench 312 is tilted (not parallel to the substrate) because of the process (e.g., etch, chemical-mechanical polish (CMP), or one or more other steps in the process). For example, two otherwise identical substrate measurement recipes use radiation beams 314 and 315 at the same incidence angle for substrate measurement, except that the radiation beams 314 and 315 are directed from different directions onto the substrate. Although the beams 314 and 315 have the same angle of incidence relative to the substrate, they do not have the same angle of incidence relative to the bottom 313 of the trench 312 because the bottom 313 is tilted relative to the substrate. Therefore, characteristics of the scattering of the beams 314 and 315 by the target are different.

FIG. 5B schematically shows a cross-sectional view of the stack of another target 320 including an upper structure 321 over a trench 322, suitable for measuring overlay error between the upper structure 321 and the trench 322. The sidewall 323 of the trench 322 is tilted (not perpendicular to the substrate) because of the process (e.g., etch, CMP, or one or more other steps in the process). For example, two otherwise identical substrate measurement recipes use radiation beams 324 and 325 at the same incidence angle for substrate measurement, except that the radiation beams 324 and 325 are directed from different directions onto the substrate. Although the beams 324 and 325 have the same angle of incidence relative to the substrate, the beam 324 glances off the sidewall 323 while the beam 325 is almost normal to the sidewall 323. The beam 324 thus is barely scattered by the sidewall 323 but the beam 325 is strongly scattered by the sidewall 323. Therefore, characteristics of the scattering of the beams 324 and 325 by the target are different.

Thus, process induced asymmetry can have a significant influence on 1st order asymmetry diffraction based measurement because it directly perturbs the difference in the 1st order diffraction intensities. As a result, an overlay measurement, for example, may be inaccurate, as it is a combination of the actual overlay observed for the metrology method and substrate measurement recipe in combination with the process induced overlay resulting from the specific wafer processes. Furthermore, the spread in measured overlay over wavelength and/or polarization of the measurement beam may be significant due to the wavelength-polarization dependency on the processing asymmetry in the stack.

So, many factors may be considered when determining a substrate measurement recipe (e.g., wavelength, polarization, etc.) to use for a given application. These include signal strength (detectability), cross-substrate stability (robustness), and within target repeatability (robustness). These metrics help ensure that the total measurement uncertainty (TMU) is reduced or minimized. But, these metrics do not necessarily exclude substrate measurement recipes which are also influenced by process induced target asymmetry. The result can be several substrate measurement recipes with very different measurement results. Accordingly, there is a desire for a process that processes data collected for substrate measurement recipe selection to, e.g., exclude substrate measurement recipes significantly impacted by process induced target asymmetry. So, in an embodiment, there is provided a method to evaluate recipe-to-recipe consistency (self-consistency) to judge, e.g., substrate measurement recipe accuracy. This can make use of the effect that, e.g., process induced asymmetry changes significantly with different substrate measurement recipes, resulting in differences in measurements. So, in this example of process induced asymmetry changes, for two substrate measurement recipes to report similar measurements, they need to either both have low process induced asymmetry influence or exactly the same amount of influence. The latter however is less likely since substrate measurement recipes involve significant changes in wavelength, polarization, and/or target design. Thus, recipe-to-recipe consistency may identify one or more effective substrate measurement recipes when multiple substrate measurement recipes have similar measurement values.

Figure 6:
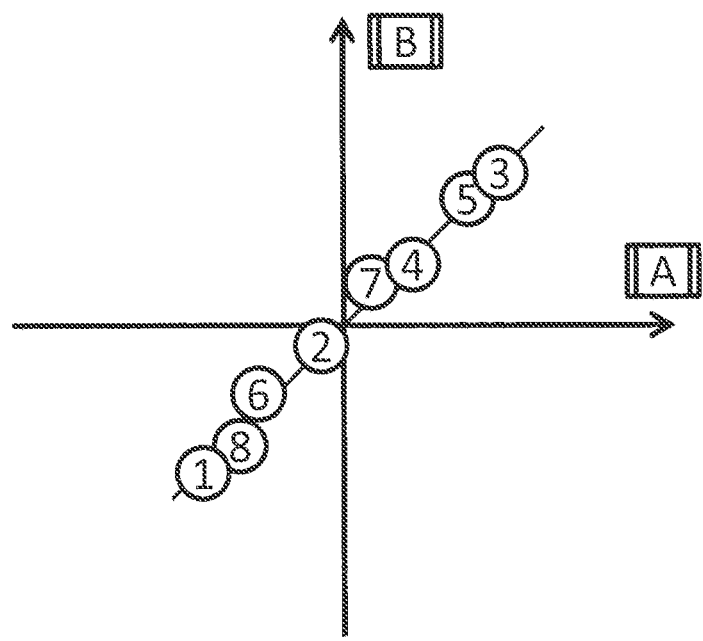
FIG. 6 shows recipe consistency, according to an embodiment.

FIG. 6 depicts example results for measurement using each of two substrate measurement recipes A and B configured to measure an overlay error (e.g., overlay error along one direction, or overall overlay error). For each of a plurality of areas on the substrate (each area having, e.g., a "programmed" different overlay error, such as a plurality of overlay errors within the range from ±A nm to ±B nm, where A is selected from the range of 0-30 nm and B is selected from the range of 0-30 nm and A and B may be equal), a value of an overlay error is obtained for each of recipes A and B. The values of the overlay error for each area may be represented by a point on a plane. The values obtained by recipe A may be the coordinate for the horizontal axis of the points and the values obtained by recipe B may be the coordinate for the vertical axis of the points. For example, FIG. 6 illustrates points that represent the values of the overlay errors for areas 1-8. For example, the point for area 1 has the overlay error obtained by recipe A in area 1 as its horizontal axis coordinate and the overlay error obtained by recipe B in area 2 as its vertical axis coordinate. Of course, many other points may be provided and there would likely be a point for recipe B near the point representing the measurement of area 1 by recipe A. If the recipes A and B are consistent, the points should be essentially on a straight line with a slope of 1 and intercept of 0. Therefore, the regression between the values obtained by recipe A and recipe B is a good measure of consistency between these recipes. The closer the slope to 1, the more consistent the recipes are. The closer the coefficient of determination $R^2$ to 1, the more consistent the recipes are. $R^2$ is a number that indicates how well data (here, overlay errors obtained by the recipes) fit a statistical model (here, a simple linear regression). In an embodiment, two recipes may be considered consistent if the slope is 1±0.1 (or 1±0.05) and/or $R^2$ is greater than or equal to 0.9 (or greater than or equal to 0.95). In the context of substrate measurement for a device fabrication process, using regression as a measurement of recipe consistency is particularly suitable for overlay errors greater than 10 nm.

Thus, FIG. 6 shows recipe consistency, according to an embodiment. So, in an embodiment, the recipe consistency among a group of substrate measurement recipes (e.g., substrate measurement recipes) is a function of regression between the values measured by or simulated for, at a plurality of areas, one substrate measurement recipe of the group and the values measured by or simulated for, at the plurality of areas, another substrate measurement recipe of the group.

Figure 7:
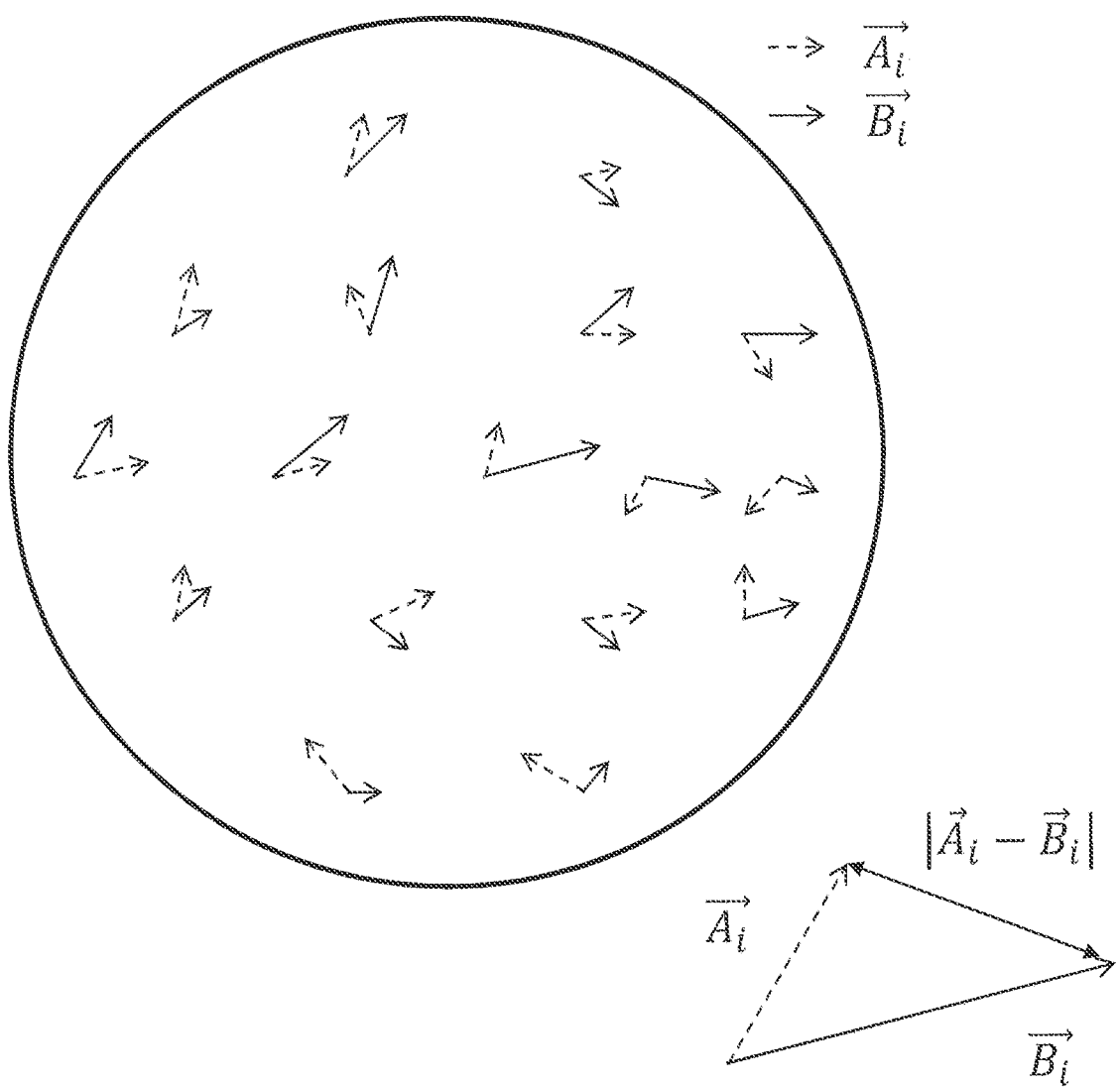
FIG. 7 shows recipe consistency, according to an embodiment.

FIG. 7 shows recipe consistency, according to an embodiment. The recipe consistency among a group of substrate measurement recipes (e.g., substrate measurement recipes that measure overlay errors) is a function of cosine similarities and Euclidian distances of the values of the measurements (e.g., overlay errors). FIG. 7 schematically shows example overlay errors obtained by (i.e., actually measured by or simulated for) recipe A and recipe B at a group of areas on a substrate (which may or may not have "programmed" different overlay error). The direction and magnitude of vectors $\vec{A}_i$ (dotted arrows) represent the overlay errors obtained by recipe A. The direction and magnitude of vectors $\vec{B}_i$ (solid arrows) represent the overlay errors obtained by recipe B. A cosine similarity is defined as $$\frac{\sum_{i=1}^{n} \vec{A}_i \cdot \vec{B}_i}{\sqrt{\left[\sum_{i=1}^{n} \vec{A}_i \cdot \vec{A}_i\right] \cdot \left[\sum_{i=1}^{n} \vec{B}_i \cdot \vec{B}_i\right]}}.$$

where n is the number of targets. The cosine similarity measures the difference in the directions between vectors $\vec{A}_i$ and vectors $\vec{B}_i$. The Euclidian distance is defined as $|\vec{A}_i\text{-}\vec{B}_i|$, which at least partially measures the difference in the magnitude of vectors $\vec{A}_i$ and vectors $\vec{B}_i$. For example, if all the Euclidian distances between vectors $\vec{A}_i$ and vectors $\vec{B}_i$ are less than or equal to 3 nm (or less than or equal to 2 nm or less than or equal to 1 nm) and the cosine similarity is greater than or equal to 0.90 (or greater than or equal to 0.95), recipes A and B may be considered consistent. Of course, other suitable criteria for consistency are possible. In the context of substrate measurement for a device fabrication process, using the cosine similarity and the Euclidian distances is particularly suitable for overlay errors less than 10 nm.

According to an embodiment, the recipe consistency among a group of substrate measurement recipes (e.g., substrate measurement recipes) is a function of differences of the values measured by or simulated for, at a plurality of areas, one substrate measurement recipe of the group and the values measured by or simulated for, at the plurality of areas, another substrate measurement recipe of the group. For example, the recipe consistency may be a function of the sum of squares of the differences. For example, the recipe consistency may be a covariance between the values measured by or simulated for a recipe and the values measured by or simulated for another recipe.

Figure 8:
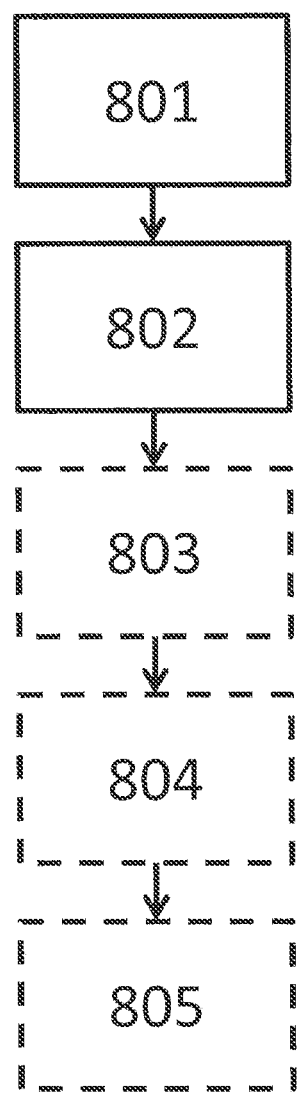
FIG. 8 shows a flow chart of a method for selecting a substrate measurement recipe from a plurality of substrate measurement recipes based on recipe consistency, according to an embodiment.

FIG. 8 shows a flow chart of a method for selecting a substrate measurement recipe from a plurality of substrate measurement recipes based on recipe consistency, according to an embodiment. In 801, recipe consistency is determined within each of a plurality of subsets of substrate measurement recipes selected from a plurality of substrate measurement recipes based on values of a characteristic at a plurality of areas on a substrate obtained using the plurality of substrate measurement recipes. The values of the characteristic may be obtained by measuring or simulating a difference between amplitudes of two diffraction orders of the diffracted radiation from the areas. The areas may include a target structure including overlaid periodic structures having a known overlay error bias. The plurality of substrate measurement recipes may differ in one or more parameters such as wavelength of radiation used in a measurement or simulation to arrive at the values, polarization of radiation used in a measurement or simulation to arrive at the values, angle of incidence of radiation used in a measurement or simulation to arrive at the values, or targets within the areas used in a measurement or simulation to arrive at the values. The values of the characteristic may be obtained by measuring or simulating diffracted radiation from the areas. The characteristic may include overlay error. In 802, a substrate measurement recipe is selected from the plurality of substrate measurement recipes based on the recipe consistency. The substrate measurement recipe may be selected by calculating a sum of recipe consistencies within all subsets that have a substrate measurement recipe in common. The substrate measurement recipe may be selected by eliminating a substrate measurement recipe from the plurality of substrate measurement recipes based on the recipe consistency. In optional 803, values that do not meet one or more detectability criteria are eliminated, from the values measured or simulated. In optional 804, the substrate is inspected using the selected substrate measurement recipe. In optional 805, prior to determining the recipe consistency, detectability of a substrate measurement recipe of the plurality of substrate measurement recipes is determined and if the detectability for the substrate measurement recipe crosses a threshold, that substrate measurement recipe is excluded from the plurality of substrate measurement recipes.

Figure 9:
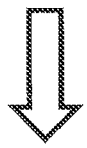
FIG. 9 schematically shows the flow of FIG. 8 applied to recipes A-D.
Figure 9:

FIG. 9 schematically shows the flow of FIG. 8 applied to recipes A-D. Recipe consistency for each pair of the recipes A-D is determined and compiled in the first table. The sums of the recipe consistencies for each recipe A-D between another recipe among the four are calculated, respectively. The recipe with the largest sum is eliminated, which is recipe A in this example. The sums of the remaining recipes B-D are recalculated. Again, the recipe with the largest sum is eliminated, which is recipe C. The remaining recipes B and D have small sums and can be considered consistent with each other. Therefore, the remaining recipes B and D may be selected as the recipe suitable for use in a substrate measurement.

So, in an embodiment, there is provided a process for quantifying the similarity of measurements and iteratively selecting the one or more best matching substrate measurement recipes. Thus, the method may be used during, for example, substrate measurement recipe selection as an indicator of substrate measurement recipe accuracy.

In an embodiment, measurements are measured, or simulated, for a substrate for a range of wavelengths, polarizations and/or targets on the substrate that are available. For example, all the wavelengths and/or polarizations available with the inspection apparatus may be measured or simulated (e.g., up to 3 polarizations and up to 9 wavelengths). In this example, each combination of wavelength, polarization, and target can be considered a substrate measurement recipe.

Optionally, for the substrate measurement recipes measured or simulated, the measurement results are filtered by one or more detectability criteria. A detectability criteria can include, e.g., target/pupil sigma, stack sensitivity, and/or intensity. In other words, those criteria need to meet a certain threshold. The detectability filtering may be performed using a simulation before actual measurements are taken with a substrate. Besides detectability, other criteria may be used to eliminate recipes such as robustness, total measurement uncertainty (TMU), speed, etc.

For the substrate measurement recipes measured or simulated (optionally, less the recipes excluded by the detectability analysis), a statistical comparison of the difference of the measurement results for a combination of substrate measurement recipes is performed. The result of this comparison is used as a similarity index of a combination of substrate measurement recipes. The statistical comparison can include root mean square (RMS) or root of sum of squares (RSS), and the comparison can be performed on raw measurement data, filtered measurement data, or the results of a model applied to the measurement data.

Then, a total score for a given substrate measurement recipe is the sum of its similarity indexes for all of its comparisons in combination with other substrate measurement recipes. The substrate measurement recipes with the highest score is removed from the data pool as this indicates the recipe least matching the remaining substrate measurement recipes and the comparison and elimination is performed iteratively with the remaining substrate measurement recipes. The iteration ends once a specified number of substrate measurement recipes remain (e.g., 1 substrate measurement recipe, 2 substrate measurement recipes, etc.), or the total score of remaining substrate measurement recipes passes a criteria (e.g., lower than a certain value). After the similarity analysis is complete, a final substrate measurement recipes selection can be performed on the remaining substrate measurement recipes on the basis of detectability, robustness, total measurement uncertainty (TMU), speed, etc.

Figure 10:
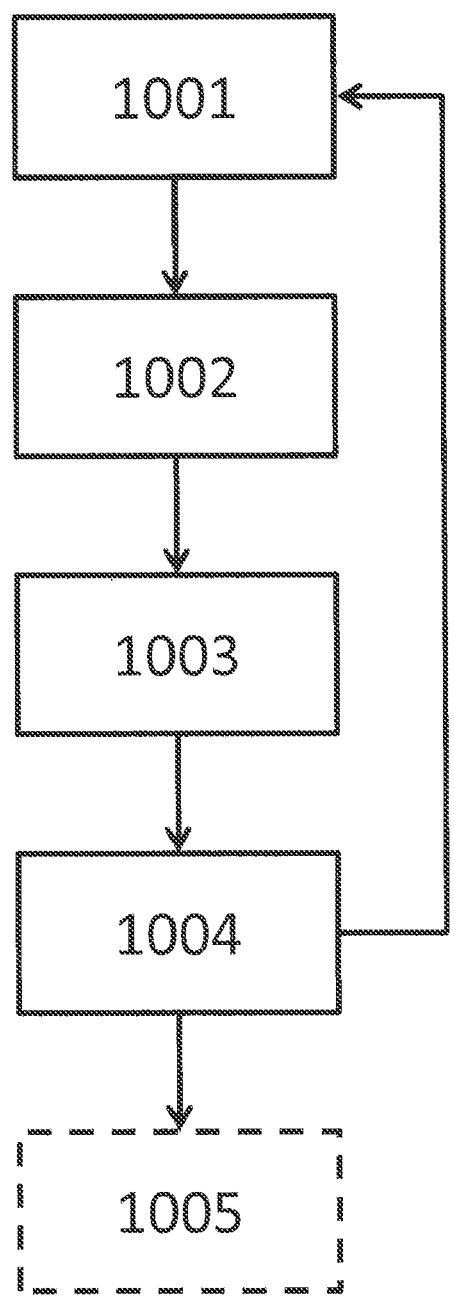
FIG. 10 shows a flow chart of a method, according to an embodiment.

FIG. 10 shows a flow chart of a method, according to an embodiment. In 1001, recipe consistencies between one substrate measurement recipe of a plurality of substrate measurement recipes and each other substrate measurement recipe of the plurality of substrate measurement recipes is determined. The recipe consistencies may be determined from values of a characteristic at a plurality of areas on a substrate obtained using the plurality of substrate measurement recipes. The characteristic may be overlay error. The values may be obtained by measuring or simulating diffracted radiation from the areas or by measuring or simulating a difference between amplitudes of two diffraction orders of the diffracted radiation from the areas. Each of the areas may include a target structure that includes overlaid periodic structures having a known overlay error bias. The plurality of substrate measurement recipes may differ in one or more parameters such as wavelength of radiation used in a measurement or simulation to arrive at the values, angle of incidence of radiation used in a measurement or simulation to arrive at the values, polarization of radiation used in a measurement or simulation to arrive at the values, or targets within the areas used in a measurement or simulation to arrive at the values. In 1002, a function of the recipe consistencies is calculated. In 1003, the one substrate measurement recipe from the plurality of substrate measurement recipes is eliminated if the function meets a criterion. In 1004, the determination of the recipe consistencies, calculation of the function and elimination is reiterated until a termination condition is met. In optional 1005, a substrate is inspected using a remaining substrate measurement recipe of the plurality of substrate measurement recipes.

Figure 11:
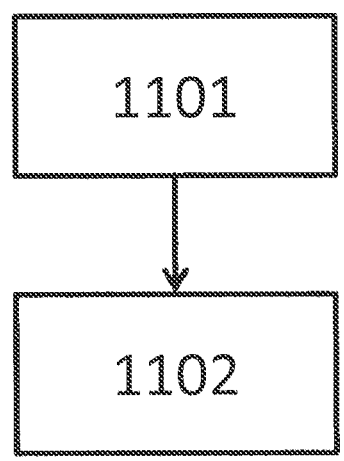
FIG. 11 shows a flow chart of a method, according to an embodiment.

FIG. 11 shows a flow chart of a method, according to an embodiment. In 1101, a substrate measurement recipe-to-substrate measurement recipe consistency analysis is performed among a plurality of substrate measurement recipes. In 1102, from the analyzed substrate measurement recipes, a substrate measurement recipe with a measure of substrate measurement recipe-to-substrate measurement recipe consistency, a measure of susceptibility to process variation, or a measure of robustness to process variation, is identified that crosses a threshold.

According to an embodiment, a substrate measurement apparatus may include a storage configured to store a plurality of substrate measurement recipes, and a processor configured to select one or more substrate measurement recipes from the plurality of substrate measurement recipes based on recipe consistencies among the plurality of substrate measurement recipes. The substrate measurement apparatus may also include a support for a substrate having a plurality of target structures thereon, each target structure comprising overlaid periodic structures having a known overlay error bias, and an optical system configured to illuminate each target structure and detect radiation diffracted by each target structure.

While the discussion herein has focused on use of the techniques herein for inspection of device substrates, the techniques here are not so limited and may be applied in other fields that device manufacturing or to other substrates than device substrates.

Process induced target asymmetry often manifests in metrology data obtained using different angular distributions of the incident light (e.g., different incident angles), especially when these different angular distributions are symmetric (e.g., mirror asymmetric, rotational asymmetric, etc.) with respect to the target without the process induced target asymmetry. Therefore, a parameter that characterizes the dependence of the metrology data on the angular distributions of the incident light is a good indicator of the existence or impact of process induced target asymmetry on metrology. Sometimes, a target may have significant process induced target asymmetry but the substrate measurement recipe used to measure the target may be insensitive to the process induced target asymmetry. The metrology data obtained using such a substrate measurement recipe should not be significantly dependent on the angular distributions of the incident light. The angular distribution of the incident light can be a beam incident along substantially a single incident direction. The angular distribution of the incident light can also include light with a range of incident directions. The angular distribution of the incident light is relative to orientation of the pattern to be measured. Rotation of the pattern around any axis (e.g., the optical axis) changes the angular distribution of the incident light. The angular distribution of the incident light may be expressed by the intensity of incident light as a function of a polar angle $\delta$ and the azimuth angle $\varphi$, in a spherical coordinate system fixed to the pattern to be measured.

One example of the parameter that characterizes the dependence of the metrology data on the angular distributions of the incident light is the derivative of the metrology data (e.g., overlay error, alignment, critical dimension (CD)) with respect to the incident angle at a fixed azimuth angle, where the metrology data are measured using substrate measurement recipes that each use a single incident beam of radiation and that are identical except in the incident angle of the beam. As an example, the derivative is obtained from the data sets resulting from a measurement of a target with a series of substrate measurement recipes, whereby each measurement recipes uses a single beam of radiation, and whereby each measurement recipe is identical except that the incident beams have incrementally different incident angles.

Another example of the parameter may include a derivative of the metrology data (e.g., overlay error, alignment, CD) with respect to the incident angle without regard to the azimuth angle, where the metrology data are measured using substrate measurement recipes that each use a cone of radiation and that are identical except in the incident angle of the radiation along the cone. The target is measured with a series of substrate measurement recipes whereby each of these substrate measurement recipes uses all light with a same incident angle and any azimuth angle. Namely, the light in each of these substrate measurement recipes propagates along a conical surface. The conical surfaces of these substrate measurement recipes have incrementally different apex angles. A set of metrology data is obtained from the same target using each of the substrate measurement recipes and the derivative is determined from such data sets.

Yet another example of the parameter may be a difference between two sets of metrology data obtained using two substrate measurement recipes with different angular distributions of the incident light (e.g., two different annular shaped angular distributions of the incident light). The position-dependent difference (e.g., average or sum of the difference across the positions) may be used as the parameter that characterizes the dependence of the metrology data on the angular distributions.

A parameter that characterizes the dependence of the metrology data on the angular distributions may be used at least in several scenarios. These scenarios include determining the robustness of a substrate measurement recipe, monitoring changes of a substrate measurement recipe with respect to time, selecting a substrate measurement recipe (including selecting the parameters of the measurement and/or selecting the parameters of the pattern measured).

For example, a method of monitoring a substrate measurement recipe comprises obtaining metrology data using a substrate measurement recipe, determining a parameter from the metrology data, where the parameter characterizes the dependence of the metrology data on the angular distribution of the incident light used in the substrate measurement recipe (examples of the parameter were given above), determining whether the parameter is within a specified range (if the parameter is not within the specified range, the substrate measurement recipe is considered unsatisfactory and substrate measurement recipe is adjusted, for example, whereby adjusting the substrate measurement recipe may include adjusting one or more parameters of the target, like shape or orientation, and/or adjusting one or more parameters of the measurement, like polarization or wavelength of the incident light of the substrate measurement recipe).

Figure 15:
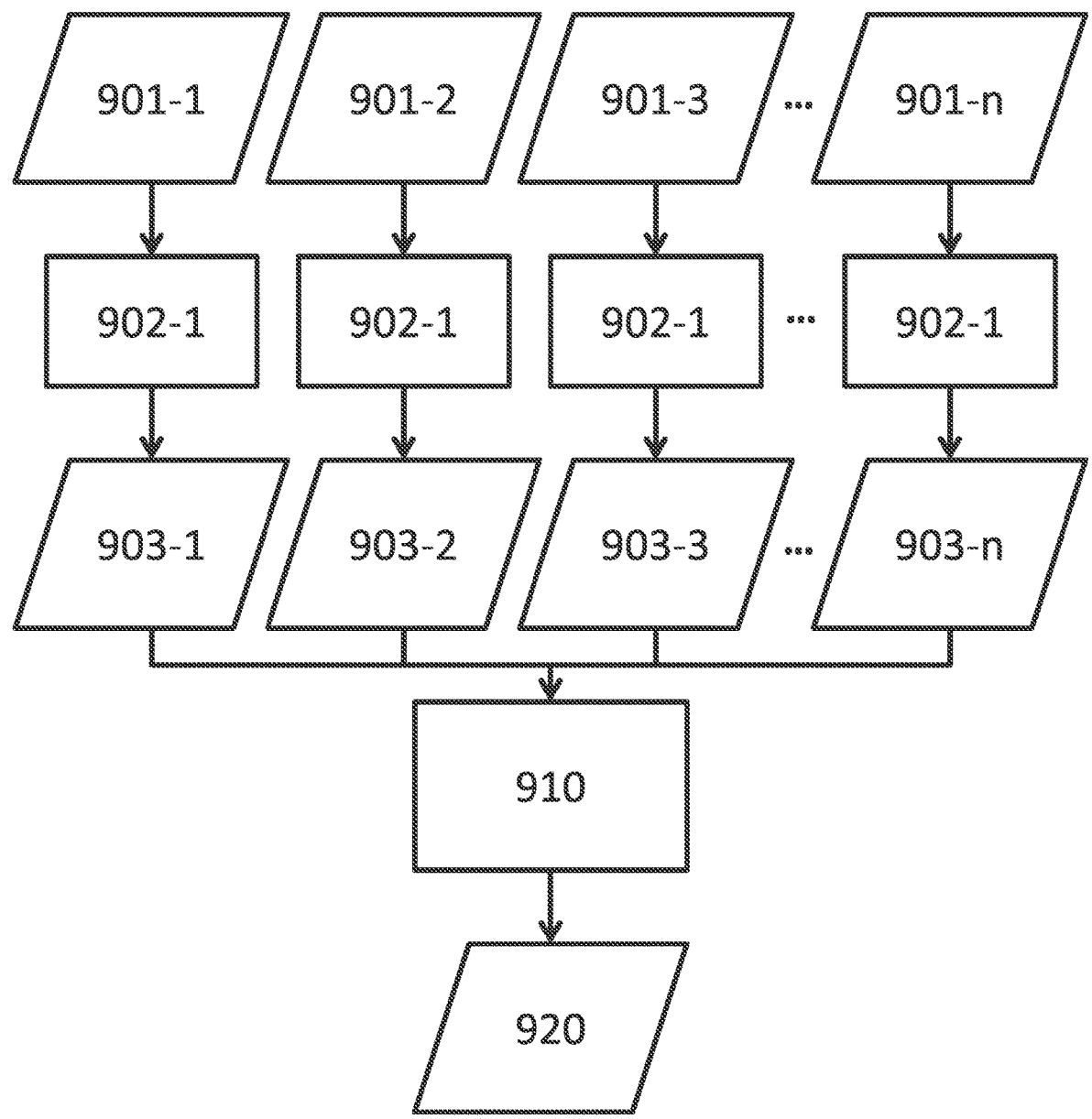
FIG. 15 schematically shows a flow for a method of selecting a substrate measurement recipe.

FIG. 15 schematically shows a flow for a method of selecting a substrate measurement recipe. Selecting a substrate measurement recipe is the same as selecting the values of all the parameters of the substrate measurement recipe. Because a substrate measurement recipe may include parameters of the target being measured, parameters of the measurement, or both, selecting a substrate measurement recipe may include selecting the values of the parameters of the target being measured, the parameters of the measurement, or both. Sets of metrology data (902-1, 902-2, . . . , 902-*n*) are respectively obtained from a group of substrate measurement recipes (901-1, 901-2, . . . , 901-*n*), from which selection will be made. For each of the substrate measurement recipes, a parameter (903-1, 903-2, . . . , 903-*n*) is determined from each of the set of metrology data obtained using that substrate measurement recipe, where the parameter characterizes the dependence of the set of metrology data on the angular distribution of the incident light used in that substrate measurement recipe. In 910, at least one substrate measurement recipe 920 is selected based on the parameter (903-1, 903-2, . . . , 903-*n*).

Disclosed herein is a method comprising: obtaining metrology data using each of a plurality of substrate measurement recipes; determining, using a computer, a parameter for each of the plurality of substrate measurement recipes from the metrology data, wherein the parameter characterizes dependence of the metrology data on an angular distribution of incident light used in the substrate measurement recipe; selecting at least one substrate measurement recipe from the plurality based on the parameters. According to an embodiment, the metrology data comprise an overlay error, alignment, or critical dimension. According to an embodiment, the metrology data comprise a characteristic of an image plane image of a target used in at least one of the plurality of substrate measurement recipes. According to an embodiment, the metrology data comprise a characteristic of a pupil plane image of a target used in at least one of the plurality of substrate measurement recipes. According to an embodiment, the parameter is a derivative of the metrology data with respect to an incident angle of the incident light at a fixed azimuth angle. According to an embodiment, determining the parameter comprises obtaining metrology data using incrementally different incident angles. According to an embodiment, the parameter is a derivative of the metrology data with respect to an incident angle of the incident light without regard to an azimuth angle. According to an embodiment, determining the parameter comprises obtaining metrology data using light propagating along conical surfaces with incrementally apex angles. According to an embodiment, the parameter is a difference between two sets of metrology data obtained using two substrate measurement recipes with different angular distributions of the incident light. According to an embodiment, at least one of the plurality of substrate measurement recipes uses a single incident beam. According to an embodiment, a target measured using at least one of the plurality of substrate measurement recipes has processed induced target asymmetry. According to an embodiment, the angular distribution of incident light is relative to orientation of a pattern measured using at least one of the plurality of substrate measurement recipes. According to an embodiment, the method further comprises inspecting a substrate using the selected substrate measurement recipe. Disclosed herein is a computer program product comprising a non-transitory computer readable medium having instructions recorded thereon, the instructions when executed by a computer implementing any of the above methods.

Further embodiments are described in below numbered clauses:

Clause 17. A method comprising:

obtaining metrology data using each of a plurality of substrate measurement recipes;

determining, using a computer, a parameter for each of the plurality of substrate measurement recipes from the metrology data, wherein the parameter characterizes dependence of the metrology data on an angular distribution of incident light used in the substrate measurement recipe;

selecting at least one substrate measurement recipe from the plurality based on the parameters.

Clause 18. The method of clause 17, wherein the metrology data comprise an overlay error, alignment, or critical dimension.

Clause 19. The method of clause 17, wherein the metrology data comprise a characteristic of an image plane image of a target used in at least one of the plurality of substrate measurement recipes.

Clause 20. The method of clause 17, wherein the metrology data comprise a characteristic of a pupil plane image of a target used in at least one of the plurality of substrate measurement recipes.

Clause 21. The method of any of clauses 17-20, wherein the parameter is a derivative of the metrology data with respect to an incident angle of the incident light at a fixed azimuth angle.

Clause 22. The method of clause 21, wherein determining the parameter comprises obtaining metrology data using incrementally different incident angles.

Clause 23. The method of any of clauses 17-20, wherein the parameter is a derivative of the metrology data with respect to an incident angle of the incident light without regard to an azimuth angle.

Clause 24. The method of clause 23, wherein determining the parameter comprises obtaining metrology data using light propagating along conical surfaces with incrementally apex angles.

Clause 25. The method of any of clauses 17-20, wherein the parameter is a difference between two sets of metrology data obtained using two substrate measurement recipes with different angular distributions of the incident light.

Clause 26. The method of any of clauses 17-25, wherein at least one of the plurality of substrate measurement recipes uses a single incident beam.

Clause 27. The method of any of clauses 17-26, wherein a target measured using at least one of the plurality of substrate measurement recipes has processed induced target asymmetry.

Clause 28. The method of any of clauses 17-27, wherein the angular distribution of incident light is relative to orientation of a pattern measured using at least one of the plurality of substrate measurement recipes.

Clause 29. The method of any of clauses 17-28, further comprising inspecting a substrate using the selected substrate measurement recipe.

Clause 30. A computer program product comprising a non-transitory computer readable medium having instructions recorded thereon, the instructions when executed by a computer implementing the method of any of clauses 17-29.

Clause 31. A method comprising:

performing a substrate measurement recipe-to-substrate measurement recipe consistency analysis among a plurality of substrate measurement recipes; and identifying, from the analyzed substrate measurement recipes, a substrate measurement recipe with a measure of substrate measurement recipe-to-substrate measurement recipe consistency, a measure of susceptibility to process variation, or a measure of robustness to process variation, that crosses a threshold.

Clause 32. A substrate measurement apparatus, comprising a storage configured to store a plurality of substrate measurement recipes, and a processor configured to select one or more substrate measurement recipes from the plurality of substrate measurement recipes based on recipe consistencies among the plurality of substrate measurement recipes.

Clause 33. The substrate measurement apparatus of clause 32, further comprising:

a support for a substrate having a plurality of target structures thereon, each target structure comprising overlaid periodic structures having a known overlay error bias; and an optical system configured to illuminate each target structure and detect radiation diffracted by each target structure.

Figure 12:
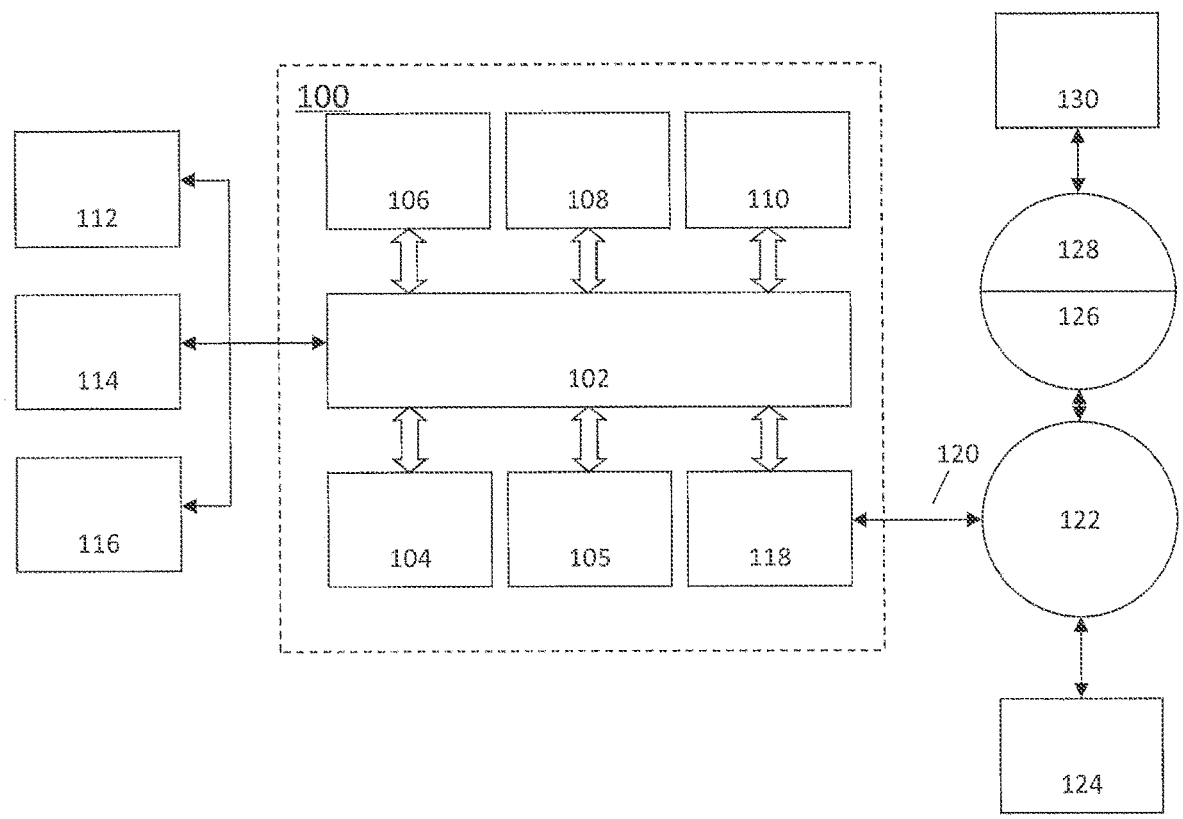
FIG. 12 is a block diagram of an example computer system.

FIG. 12 is a block diagram that illustrates a computer system 100 which can assist in implementing the methods and flows disclosed herein. Computer system 100 includes a bus 102 or other communication mechanism to communicate information, and a processor 104 (or multiple processors 104 and 105) coupled with bus 102 to process information. Computer system 100 may also include a main memory 106, such as a random access memory (RAM) or other dynamic storage device, coupled to bus 102 to store and/or supply information and instructions to be executed by processor 104. Main memory 106 may be used to store and/or supply temporary variables or other intermediate information during execution of instructions to be executed by processor 104. Computer system 100 may further include a read only memory (ROM) 108 or other static storage device coupled to bus 102 to store and/or supply static information and instructions for processor 104. A storage device 110, such as a magnetic disk or optical disk, may be provided and coupled to bus 102 to store and/or supply information and instructions.

Computer system 100 may be coupled via bus 102 to a display 112, such as a cathode ray tube (CRT) or flat panel or touch panel display, to display information to a computer user. An input device 114, including alphanumeric and other keys, may be coupled to bus 102 to communicate information and command selections to processor 104. Another type of user input device may be cursor control 116, such as a mouse, a trackball, or cursor direction keys, to communicate direction information and command selections to processor 104 and to control cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a disk or memory of a remote computer. The remote computer can load the instructions into its dynamic memory and send the instructions over a communications path. Computer system 100 can receive the data from the path and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may include a communication interface 118 coupled to bus 102. Communication interface 118 provides a two-way data communication coupling to a network link 120 that is connected to a network 122. For example, communication interface 118 may provide a wired or wireless data communication connection. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through network 122 to a host computer 124 or to data equipment operated by an Internet Service Provider (ISP) 126. ISP 126 in turn provides data communication services through the worldwide packet data communication network, now commonly referred to as the "Internet" 128. Network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, network 122 and communication interface 118. One such downloaded application may provide for the code to implement a method herein, for example. The received code may be executed by processor 104 as it is received, and/or stored in storage device 110, or other non-volatile storage for later execution. In this manner, computer system 100 may obtain application code in the form of a carrier wave.

Figure 13:
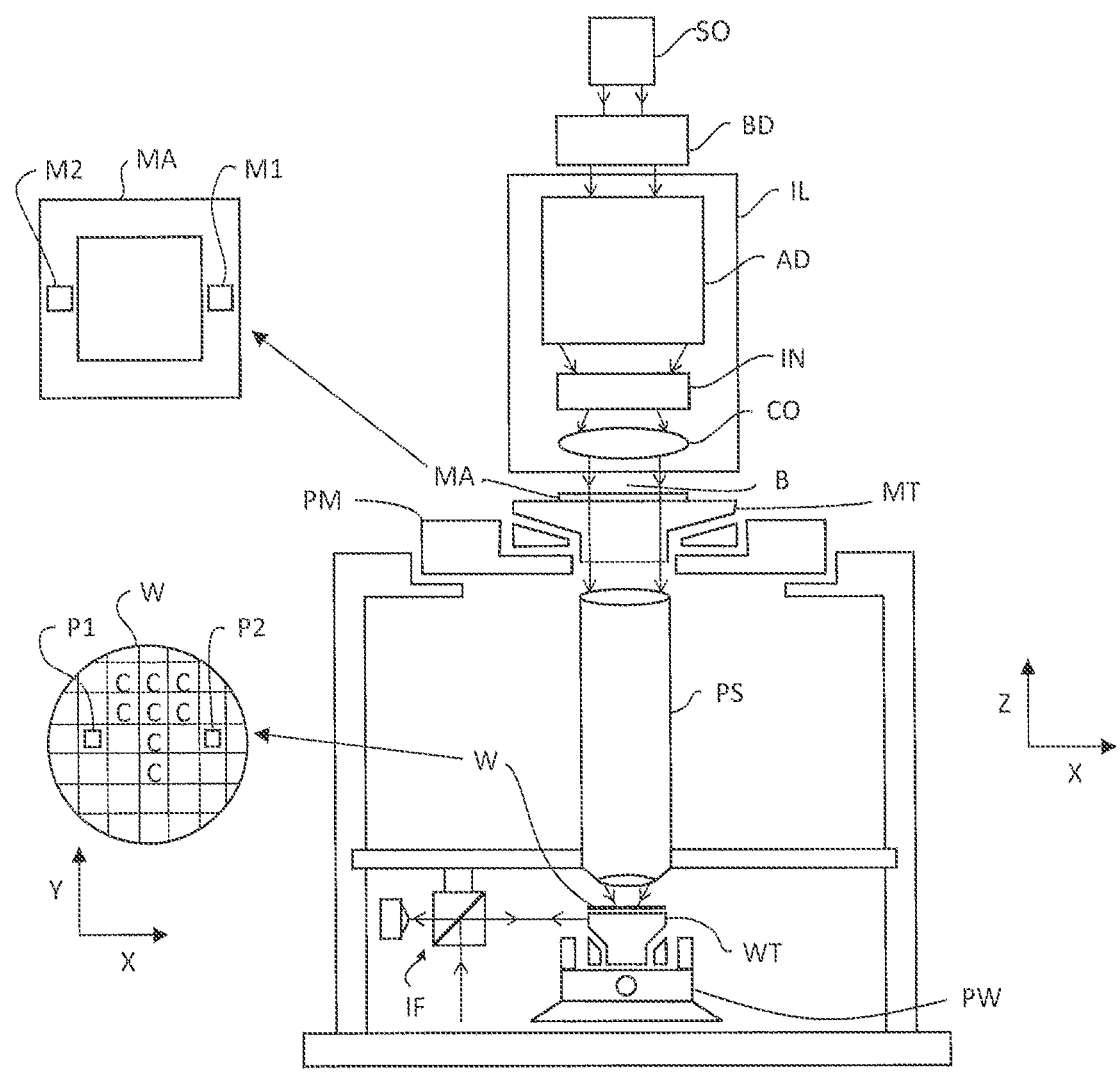
FIG. 13 is a schematic diagram of a lithographic apparatus.

FIG. 13 schematically depicts an exemplary lithographic apparatus. The apparatus comprises:
  an illumination system IL, to condition a beam B of radiation. In this particular case, the illumination system also comprises a radiation source SO;
  a first object table (e.g., mask table) MT provided with a patterning device holder to hold a patterning device MA (e.g., a reticle), and connected to a first positioner PM to accurately position the patterning device with respect to item PS;
  a second object table (substrate table) WT provided with a substrate holder to hold a substrate W (e.g., a resist-coated silicon wafer), and connected to a second positioner PW to accurately position the substrate with respect to item PS;
  a projection system PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander. The illuminator IL may comprise an adjuster AD configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 13 that the source SO may be within the housing of the lithographic apparatus (as is often the case when the source SO is a mercury lamp, for example), but that it may also be remote from the lithographic apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g. so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 13.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features.

Figure 14:
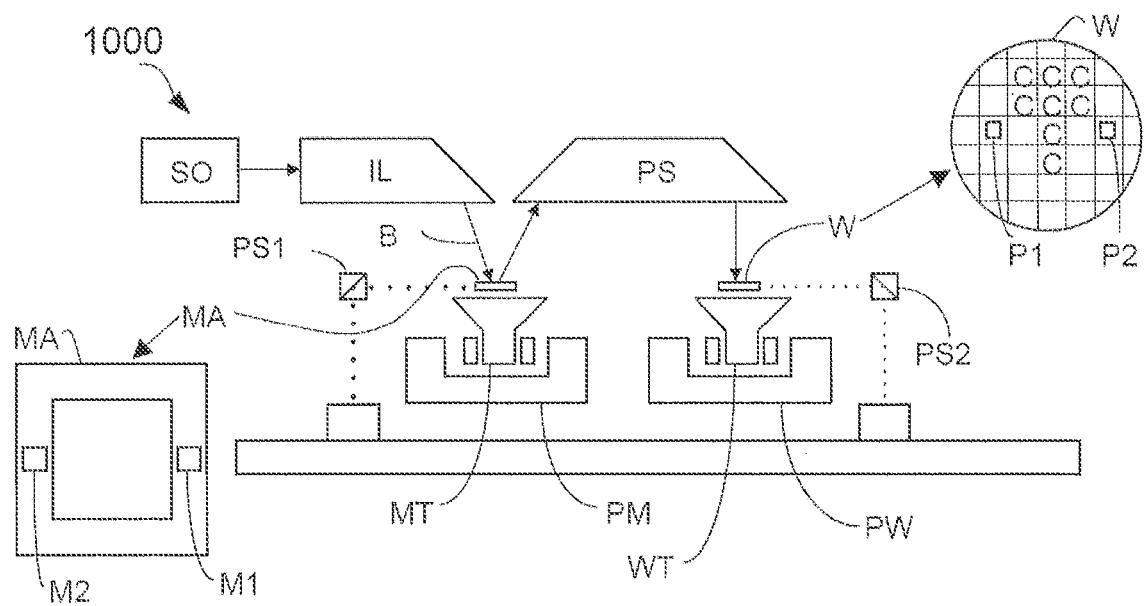
FIG. 14 is a schematic diagram of another lithographic apparatus.

FIG. 14 schematically depicts another exemplary lithographic apparatus 1000. The lithographic apparatus 1000 includes:
  a source collector module SO
  an illumination system (illuminator) IL configured to condition a radiation beam B (e.g. EUV radiation).
  a support structure (e.g. a mask table) MT constructed to support a patterning device (e.g. a mask or a reticle) MA and connected to a first positioner PM configured to accurately position the patterning device;
  a substrate table (e.g. a wafer table) WT constructed to hold a substrate (e.g. a resist coated wafer) W and connected to a second positioner PW configured to accurately position the substrate; and
  a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have a multilayer reflector comprising, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 14, the illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 14, to provide the laser beam to excite the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously in a given direction (the so-called "scan direction") while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Further, the lithographic apparatus may be of a type having two or more tables (e.g., two or more substrate table, two or more patterning device tables, and/or a substrate table and a table without a substrate). In such "multiple stage" devices the additional tables may be used in parallel, or preparatory steps may be carried out on one or more tables while one or more other tables are being used for exposures. Twin stage lithographic apparatuses are described, for example, in U.S. Pat. No. 5,969,441, incorporated herein by reference in its entirety.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are known in the art for increasing the numerical aperture of projection systems. The term "immersion" as used herein does not mean that a structure, such as a substrate, must be submerged in liquid, but rather only means that liquid is located between the projection system and the substrate during exposure.

While the concepts disclosed herein may be used with device manufacturing on a substrate such as a silicon wafer, it shall be understood that the disclosed concepts may be used with any type of lithographic imaging systems, e.g., those used for imaging on substrates other than silicon wafers.

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic apparatus, no matter where the optical component is located on an optical path of the lithographic apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Thus, a lithographic apparatus using the imprint technology typically include a template holder to hold an imprint template, a substrate table to hold a substrate and one or more actuators to cause relative movement between the substrate and the imprint template so that the pattern of the imprint template can be imprinted onto a layer of the substrate.

The descriptions above are intended to be illustrative, not limiting. Thus, it will be apparent to one skilled in the art that modifications may be made as described without departing from the scope of the claims set out below.

What is claimed is:

1. A method comprising:
   determining recipe consistencies between one substrate measurement recipe of a plurality of substrate measurement recipes and each other substrate measurement recipe of the plurality of substrate measurement recipes;
   calculating, by a hardware computer system, a function of the recipe consistencies;
   determining that the function meets a criterion;
   eliminating the one substrate measurement recipe from the plurality of substrate measurement recipes responsive to the function meeting the criterion; and
   reiterating the determining, calculating and eliminating until one or more desired substrate measurement recipes from the plurality of substrate measurement recipes are determined.

2. The method of claim 1, wherein the recipe consistencies are determined from values of a characteristic at a plurality of areas on a substrate obtained using the plurality of substrate measurement recipes.

3. The method of claim 2, wherein the characteristic is overlay error or a relative position of a substrate.

4. The method of claim 2, wherein the values are obtained by measuring or simulating diffracted radiation from the areas.

5. The method of claim 2, wherein the values are obtained by measuring or simulating a difference between amplitudes of two diffraction orders of the diffracted radiation from the areas.

6. The method of claim 2, wherein each of the areas comprises a target structure, the target structure comprising overlaid periodic structures having a known overlay error bias.

7. The method of claim 1, wherein the plurality of substrate measurement recipes differ in one or more parameters selected from: wavelength of radiation used in a measurement or simulation to arrive at the values, polarization of radiation used in a measurement or simulation to arrive at the values, targets within the areas used in a measurement or simulation to arrive at the values, or angle of incidence of radiation used in a measurement or simulation to arrive at the values.

8. The method of claim 1, further comprising inspecting a substrate using a remaining substrate measurement recipe of the plurality of substrate measurement recipes.

9. A non-transitory computer program product comprising machine-readable instructions therein, the instructions, upon execution by a processor system, configured to cause the processor system to cause performance of at least:
   determine recipe consistencies between one substrate measurement recipe of a plurality of substrate measurement recipes and each other substrate measurement recipe of the plurality of substrate measurement recipes;
   calculate a function of the recipe consistencies;
   eliminate the one substrate measurement recipe from the plurality of substrate measurement recipes responsive to the function meeting a criterion; and
   reiterate the determination, calculation and elimination until one or more desired substrate measurement recipes from the plurality of substrate measurement recipes are determined.

10. The computer program product of claim 9, wherein the instructions are further configured to performance of an inspection of a substrate using a remaining substrate measurement recipe of the plurality of substrate measurement recipes.

11. A method comprising:
   performing, by a hardware computer, a substrate measurement recipe-to-substrate measurement recipe consistency analysis among a plurality of substrate measurement recipes; and
   identifying, from the analyzed substrate measurement recipes, a substrate measurement recipe with a value representing substrate measurement recipe-to-substrate measurement recipe consistency, a value representing of susceptibility to process variation, or a value representing robustness to process variation, that crosses a threshold.

12. The method of claim 11, wherein the substrate measurement recipes are configured for measuring overlay error, alignment or critical dimension.

13. The method of claim 11, wherein the plurality of substrate measurement recipes differ in one or more parameters selected from: wavelength of radiation used in a measurement or simulation, polarization of radiation used in a measurement or simulation, measurement targets used in a measurement or simulation, or angle of incidence of radiation used in a measurement or simulation.

14. The method of claim 11, further comprising obtaining metrology data using each of the plurality of substrate measurement recipes and identifying the substrate measurement recipe based on the metrology data.

15. The method of claim 14, wherein the metrology data comprise a characteristic of an image or pupil plane image of a target used in at least one of the plurality of substrate measurement recipes.

16. The method of claim 11, wherein at least one of the plurality of substrate measurement recipes uses a single incident beam.

17. The method of claim 11, further comprising inspecting a substrate using the identified substrate measurement recipe.

18. A non-transitory computer program product comprising machine-readable instructions therein, the instructions, upon execution by a processor system, configured to cause the processor system to at least:

perform a substrate measurement recipe-to-substrate measurement recipe consistency analysis among a plurality of substrate measurement recipes; and identify, from the analyzed substrate measurement recipes, a substrate measurement recipe with a value representing substrate measurement recipe-to-substrate measurement recipe consistency, a value representing susceptibility to process variation, or a value representing robustness to process variation, that crosses a threshold.

19. A substrate measurement apparatus, comprising a non-transitory storage configured to store a plurality of substrate measurement recipes, and a hardware processor configured to select one or more substrate measurement recipes from the plurality of substrate measurement recipes based on recipe consistencies among the plurality of substrate measurement recipes.

20. The substrate measurement apparatus of claim 19, further comprising:

a support for a substrate having a plurality of target structures thereon, each target structure comprising overlaid periodic structures having a known overlay error bias; and an optical system configured to illuminate each target structure and detect radiation diffracted by each target structure.

* * * * *